(12) United States Patent
Kim

(10) Patent No.: US 8,891,327 B2
(45) Date of Patent: Nov. 18, 2014

(54) SEMICONDUCTOR MEMORY APPARATUS

(75) Inventor: Ju Young Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 288 days.

(21) Appl. No.: 13/468,293

(22) Filed: May 10, 2012

(65) Prior Publication Data
US 2012/0287731 A1 Nov. 15, 2012

(30) Foreign Application Priority Data
May 11, 2011 (KR) .................. 10-2011-0043893

(51) Int. Cl.
*G11C 7/04* (2006.01)
*G11C 11/406* (2006.01)

(52) U.S. Cl.
CPC ............ *G11C 7/04* (2013.01); *G11C 11/40626* (2013.01)
USPC ......................................... 365/211; 365/222

(58) Field of Classification Search
CPC .......................... G11C 11/40626; G11C 7/04
USPC ................................................. 365/211, 222
See application file for complete search history.

(56) References Cited

U.S. PATENT DOCUMENTS

| | | | |
|---|---|---|---|
| 2008/0247252 A1* | 10/2008 | Ruf et al. ................ | 365/211 |
| 2009/0091979 A1* | 4/2009 | Shalvi .................... | 365/185.09 |
| 2010/0195412 A1* | 8/2010 | Furutani et al. ......... | 365/189.05 |
| 2012/0224425 A1* | 9/2012 | Fai et al. ................ | 365/185.09 |

* cited by examiner

*Primary Examiner* — Vu Le
(74) *Attorney, Agent, or Firm* — William Park & Associates Patent Ltd.

(57) ABSTRACT

A semiconductor memory apparatus includes: a plurality of memory blocks; and a plurality of temperature sensors disposed adjacent to the respective memory blocks and configured to output a plurality of preliminary temperature sensing signals whose voltage levels are controlled in response to temperature change. A preliminary temperature sensing signal indicating the highest temperature among the plurality of preliminary temperature sensing signals is detected and used as a temperature sensing signal.

14 Claims, 5 Drawing Sheets

US 8,891,327 B2

SEMICONDUCTOR MEMORY APPARATUS

CROSS-REFERENCES TO RELATED APPLICATION

The present application claims priority under 35 U.S.C. §119(a) to Korean application number 10-2011-0043893, filed on May 11, 2011, in the Korean Intellectual Property Office, which is incorporated herein by reference in its entirety.

BACKGROUND

1. Technical Field

The present invention relates generally to a semiconductor circuit, and more particularly to a semiconductor memory apparatus.

2. Related Art

FIG. 1 is a diagram illustrating the structure of a known semiconductor memory apparatus.

Referring to FIG. 1, the semiconductor memory apparatus has a wide input/output (IO) architecture capable of performing a data input/output operation at high speed with an increased data bandwidth.

The semiconductor memory apparatus includes a plurality of memory blocks 10, 20, . . . , 40 arranged in a two-dimensional manner, and a wide IO line (not illustrated) is formed between the respective memory blocks 10, 20, . . . , 40. That is, the semiconductor memory apparatus inputs and outputs data using a large data bandwidth.

Among the plurality of memory blocks 10, 20, . . . , 40, the first memory block 10 will be representatively described in detail as follows. The first memory block 10 includes a plurality of memory banks BANK0 to BANK3. Each of the memory banks includes a plurality of memory cells arranged in a two dimensional manner. A row control area includes a circuit for controlling a row path of each memory bank, and a column control area includes a circuit for controlling a column path of each memory bank.

A peripheral circuit area includes a command processing circuit, a power supply circuit, an input/output circuit and the like, in order to control the operations of the memory blocks 10, 20, . . . , 40.

When the operation of a specific memory block among the plurality of memory blocks 10, 20, . . . , 40 is repetitively performed, the temperature of a spot where the operation of the memory block is repetitively performed may excessively increase in comparison with other spots. Hereafter, a spot where the operation of a specific memory block is repetitively performed or the temperature is increased by heat transferred from outside will be referred to as 'hot spot'.

A semiconductor memory apparatus consisting of memory cells for storing data through electric charges of capacitors should perform a refresh operation at each predetermined cycle, in order to maintain the data stored in the memory cells. As the temperature increases, the time during which the data stored in the memory cells are maintained decreases. Therefore, the refresh operation cycle should be set to become shorter with the increase in temperature.

The semiconductor memory apparatus of FIG. 1 includes a temperature compensated self refresh circuit (TCSR) 50. The TCSR 50 is configured to control the refresh operation cycle based on temperature sensed by a temperature sensor T_SENSOR included therein.

As illustrated in FIG. 1, however, when a hot spot occurs in the third memory bank BANK2 of the second memory block 20, the TCSR 50 does not accurately reflect the temperature increase of the hot spot in controlling the refresh operation cycle, because the hot spot and the TCSR 50 are separated at a large distance from each other. Therefore, the reliability of data stored in memory cells adjacent to the hot spot may decrease.

SUMMARY

A semiconductor memory apparatus capable of precisely performing temperature detection is described herein.

Furthermore, a semiconductor memory apparatus capable of stably controlling a refresh cycle through precise temperature detection.

In an embodiment of the present invention, a semiconductor memory apparatus includes: a plurality of memory blocks; and a plurality of temperature sensors disposed adjacent to the respective memory blocks and configured to output a plurality of preliminary temperature sensing signals whose voltage levels are controlled in response to temperature change. A preliminary temperature sensing signal indicating the highest temperature among the plurality of preliminary temperature sensing signals is detected and used as a temperature sensing signal.

In an embodiment of the present invention, there is provided a semiconductor memory apparatus including a plurality of chips which are vertically stacked and configured to exchange signals through a plurality of through-chip vias. Each of the chips includes: a plurality of memory blocks; and a plurality of temperature sensors disposed adjacent to the respective memory blocks and configured to output a plurality of preliminary temperature sensing signals whose voltage levels are controlled in response to temperature change, when the chip transfers a plurality of preliminary temperature sensing signals thereof to an adjacent chip through the plurality of through-chip vias, the chip compares the preliminary temperature sensing signals thereof to the preliminary temperature sensing signals transferred from the adjacent chip, and transfers only a preliminary temperature sensing signal indicating the highest temperature, and a temperature compensated self refresh circuit (TCSR) included in any one of the plurality of chips is configured to control an activation cycle of a refresh periodic signal according to any one preliminary temperature sensing signal indicating the highest temperature among the plurality of preliminary sensing signals transferred through the plurality of through-chip vias.

In an embodiment of the present invention, a semiconductor memory apparatus includes: a first temperature sensor arranged at a first region of the semiconductor memory apparatus; a second temperature sensor arranged at a second region of the semiconductor memory apparatus; a temperature comparison unit configured to compare sensing results of the first and second temperature sensors; and a controller configured to control operations of the first and second regions in response to the output of the temperature comparison unit.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 1:
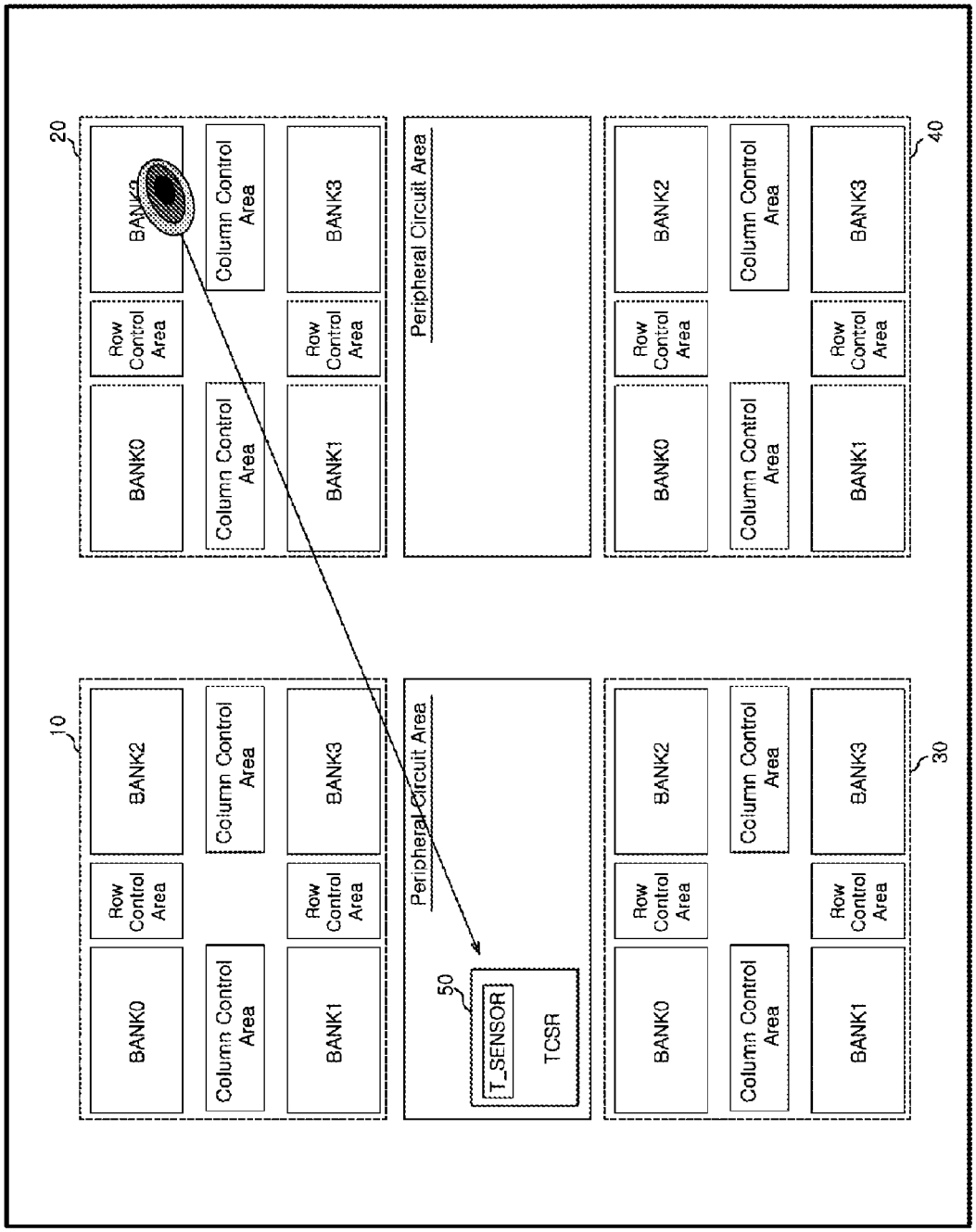
FIG. 1 is a diagram illustrating the structure of a known semiconductor memory apparatus.
Figure 2:
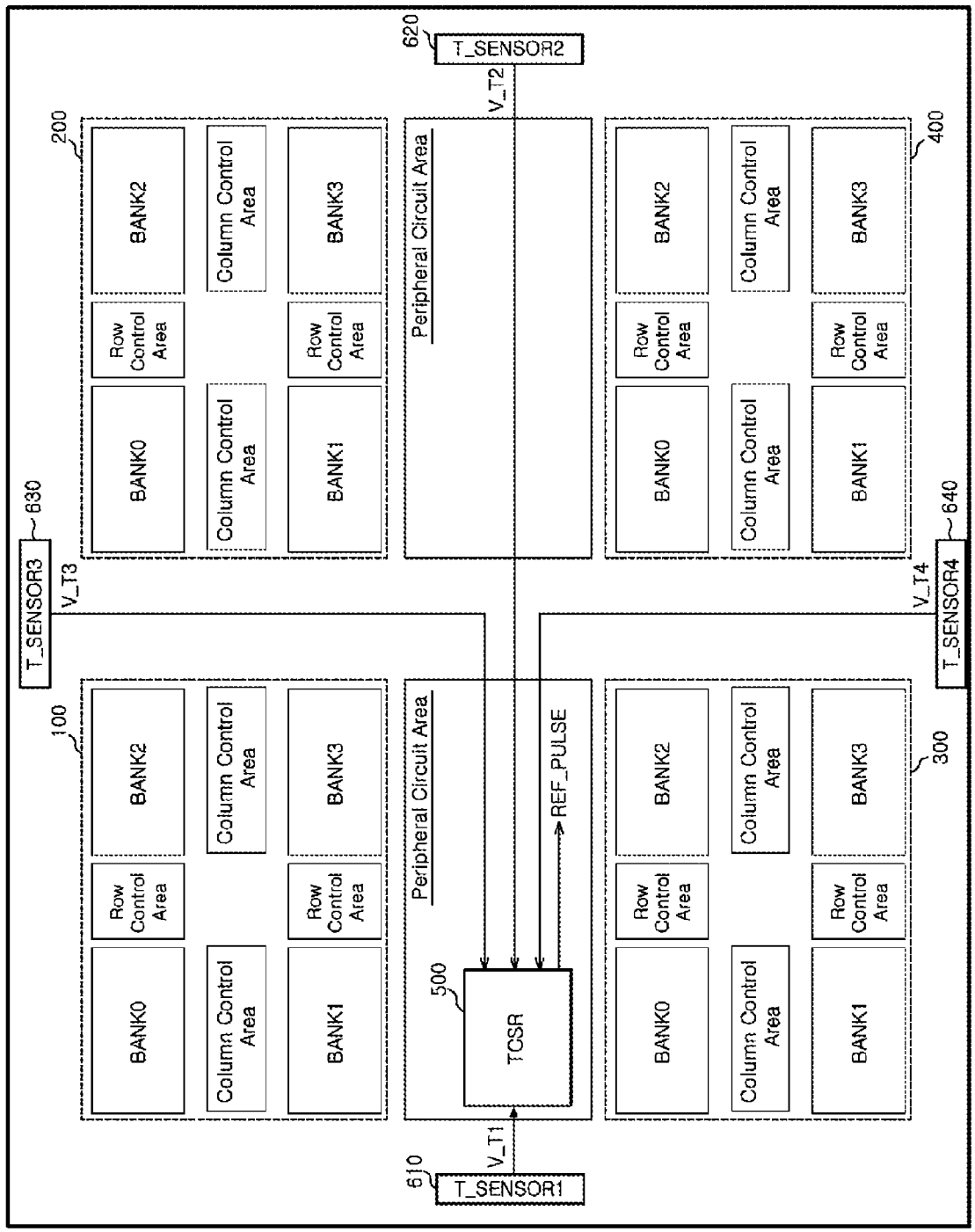
FIG. 2 is a diagram illustrating the structure of a semiconductor memory apparatus according to an embodiment of the present invention.

FIG. 2 is a diagram illustrating the structure of a semiconductor memory apparatus according to an embodiment of the present invention.

The semiconductor memory apparatus according to FIG. 2 includes only simple components for clearly describing the technical idea of the present invention.

Referring to FIG. 2, the semiconductor memory apparatus includes a plurality of memory blocks 100, 200, ..., 400 and a plurality of temperature sensors 610, 620, ..., 640, and a TCSR 500.

The semiconductor memory apparatus according to an embodiment of the present invention has a wide IO architecture capable of performing a data input/output operation at high speed with an increased data bandwidth.

In the semiconductor memory apparatus according to an embodiment of the present invention, the plurality of memory blocks 100, 200, ..., 400 are arranged in a two-dimensional manner, and a wide input/output line (not illustrated) is formed between the respective memory blocks 100, 200, ..., 400. That is, the semiconductor memory apparatus inputs and outputs data using a large data bandwidth.

Among the plurality of memory blocks 100, 200, ..., 400, the first memory block 100 will be representatively described in detail as follows. The first memory block 100 includes a plurality of memory banks BANK0, BANK1, ..., BANK3, and each memory bank includes a plurality of memory cells arranged in a two dimensional manner. A row control area includes a circuit for controlling a row path of each memory bank, and a column control area includes a circuit for controlling a column path of each memory bank.

A peripheral circuit area includes a command processing circuit, a power supply circuit, an input/output circuit and the like, in order to control the operations of the memory blocks 100, 200, ..., 400.

The plurality of temperature sensors 610, 620, ..., 640 may be disposed adjacent to the respective memory blocks 100, 200, ..., 400, and configured to output a plurality of preliminary temperature sensing signals V_T1, V_T2, ..., V_T4 of which the voltage levels are controlled in response to temperature change. In an embodiment of the present invention, the plurality of temperature sensors 610, 620, ..., 640 may be disposed in the area of the respective memory blocks 100, 200, ..., 400. In an embodiment of the present invention, the voltage levels of the preliminary temperature sensing signals V_T1, V_T2, ..., V_T4 decrease along with a temperature increase.

The TCSR 500 may be configured to control the activation cycle of a refresh periodic signal REF_PULSE according to any one preliminary temperature sensing signal indicating the highest temperature, among the plurality of preliminary temperature sensing signals V_T1, V_T2, ..., V_T4. In an embodiment of the present invention, the TCSR 500 may be configured to control the activation cycle of a refresh periodic signal REF_PULSE according the comparison result between two or more of the plurality of preliminary temperature sensing signals V_T1, V_T2, ..., V_T4. As the temperature increases, the activation cycle of the refresh periodic signal REF_PULSE becomes shorter.

Each of the memory blocks 100, 200, ..., 400 is configured to perform a refresh operation whenever the refresh periodic signal REF_PULSE is activated. When the operation of a specific memory block among the plurality of memory blocks 100, 200, ..., 400 is repetitively performed, the temperature of the spot where the operation of the memory block is repetitively performed may excessively increase in comparison with other spots. Hereafter, a spot where the temperature is higher than other areas, e.g., a spot where the operation of a specific memory block is repetitively performed or the temperature is increased by heat transferred from outside will be referred to as 'hot spot'.

A semiconductor memory apparatus consisting of memory cells for storing data through electric charges of capacitors should perform a refresh operation at each predetermined cycle to maintain the data stored in the memory cells. As the temperature increases, the time during which the data stored in the memory cells are maintained decreases. Therefore, the refresh operation cycle should be set to become shorter with the increase in temperature.

The semiconductor memory apparatus in accordance with an embodiment of the present invention controls the activation cycle of the refresh periodic signal REF_PULSE based on a preliminary temperature sensing signal indicating the highest temperature, among a plurality of preliminary temperature sensing signals V_T1, V_T2, ..., V_T4 outputted from the respective temperature sensors 610, 620, ..., 640 disposed in different areas. In an embodiment of the present invention, the semiconductor memory apparatus may be configured to control the activation cycle of a refresh periodic signal REF_PULSE based on the comparison result between two or more of the plurality of preliminary temperature sensing signals V_T1, V_T2, ..., V_T4.

Since the voltage level of a preliminary temperature sensing signal decreases with an increase in temperature, the TCSR 500 shortens the activation cycle of the refresh periodic signal REF_PULSE with the decrease in voltage level of the preliminary temperature sensing signal.

The semiconductor memory apparatus according to an embodiment of the present invention senses the temperature through the plurality of temperature sensors 610, 620, ..., 640 disposed in different areas and controls the refresh operation cycle, even though a hot spot occurs in a specific area. Therefore, the temperature may be more accurately reflected to thereby improve the reliability of data stored in memory cells adjacent to the hot spot.

Figure 3:
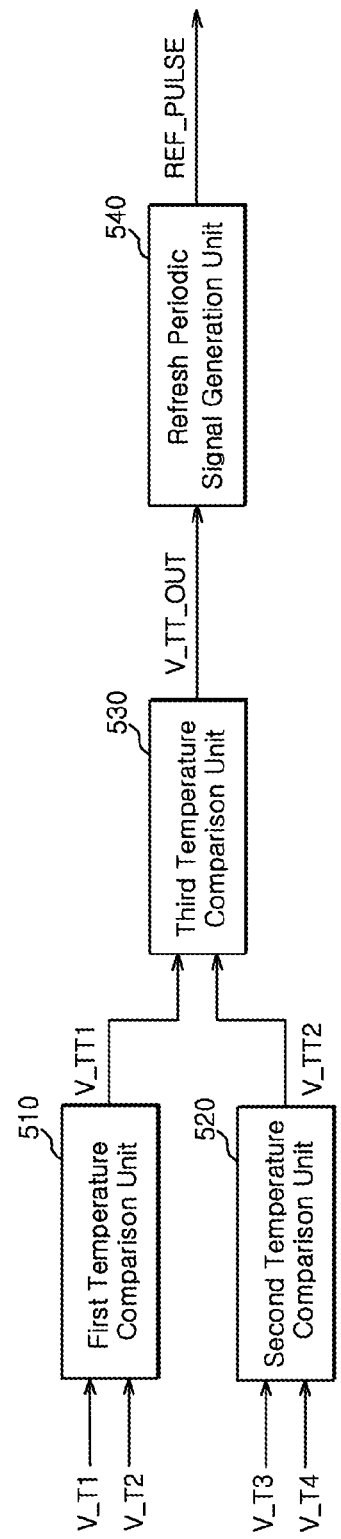
FIG. 3 is a configuration diagram of a TCSR of FIG. 2.

FIG. 3 is a configuration diagram of the TCSR of FIG. 2.

Referring to FIG. 3, the TCSR 500 includes a first temperature comparison unit 510, a second temperature comparison unit 520, a third temperature comparison unit 530, and a refresh periodic signal generation unit 540.

The plurality of temperature comparison units 510, 520 and 530 are configured to compare the plurality of preliminary temperature sensing signals V_T1, V_T2, ..., V_T4 and output a preliminary temperature sensing signal having the lowest voltage level as a temperature sensing signal V_TT_OUT.

More specifically, the first temperature comparison unit 510 is configured to compare the voltage levels of the first and second preliminary temperature sensing signals V_T1 and V_T2, and output a signal having a lower voltage level between the two signals as a first output signal V_TT1. Furthermore, the second temperature comparison unit 520 is configured to compare the voltage levels of the third and fourth preliminary temperature sensing signals V_T3 and V_T4, and output a signal having a lower voltage level between the two signals as a second output signal V_TT2. Furthermore, the third temperature comparison unit 530 is configured to compare the first output signal V_TT1 outputted from the first temperature comparison unit 510 to the second output signal V_TT2 outputted from the second temperature comparison unit 520, and output a signal having a lower voltage level between the two signals as the temperature sensing signal V_TT_OUT.

The refresh periodic signal generation unit 540 is configured to control the activation cycle of the refresh periodic signal REF_PULSE according to change in the voltage level of the temperature sensing signal V_TT_OUT. Here, the activation cycle of the refresh periodic signal REF_PULSE becomes shorter as the voltage level of the temperature sensing signal V_TT_OUT decreases. For reference, when the voltage level of the temperature sensing signal V_TT_OUT decreases, it means that the temperature of the semiconductor memory apparatus increases.

Since the plurality of temperature comparison units 510, 520 and 530 may consist of the same circuits, the configuration of the first temperature comparison unit 510 will be representatively described in detail as follows.

Figure 4:
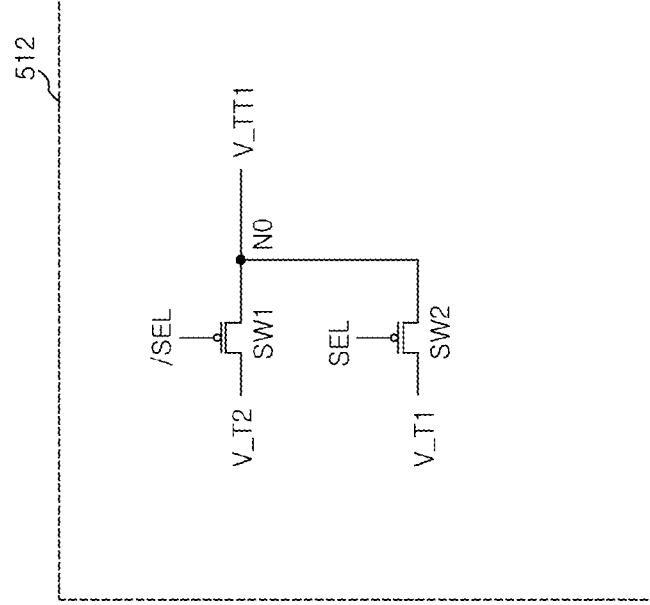
FIG. 4 is a circuit diagram of a first temperature comparison unit of FIG. 3.

FIG. 4 is a circuit diagram of the first temperature comparison unit of FIG. 3.

Referring to FIG. 4, the first temperature comparison unit 510 includes a comparator 511 and a selector 512.

The comparator 511 is configured to compare the voltage levels of the first and second temperature sensing signals V_T1 and V_T2 and output the comparison result as a primary select signal SEL and a secondary select signal /SEL. Here, the comparator 511 includes a plurality of differential amplification circuits MP1, MP2, MN1, MN2, and MN3 having current mirrors. The primary select signal SEL and the secondary select signal /SEL have opposite levels to each other.

The comparator 511 compares the voltage levels of the first and second preliminary temperature sensing signals V_T1 and V_T2, when an enable signal EN is activated to a high level. When the voltage level of the first preliminary temperature sensing signal V_T1 is lower than the voltage level of the second preliminary temperature sensing signal V_T2, the comparator 511 outputs the primary select signal SEL as a low level. Furthermore, when the voltage level of the first preliminary temperature sensing signal V_T1 is higher than the voltage level of the second preliminary temperature sensing signal V_T2, the comparator 511 outputs the primary select signal SEL as a high level.

The selector 512 selectively outputs any one of the first and second preliminary temperature sensing signals V_T1 and V_T2 according to the control of the primary select signal SEL and the secondary select signal /SEL. The selector 512 includes a first switch SW1 configured to selectively output the second preliminary temperature sensing signal V_T2 according to the control of the secondary select signal /SEL and a second switch SW2 configured to selectively output the first preliminary temperature sensing signal V_T1 according to the control of the primary select signal SEL.

The selector 512 outputs the first preliminary temperature sensing signal V_T1 as the first output signal V_TT1, when the primary select signal SEL is at a low level. Furthermore, the selector 512 outputs the second preliminary temperature sensing signal V_T2 as the first output signal V_TT1 when the secondary select signal /SEL is at a low level.

As a result, a signal having a lower voltage level between the first and second preliminary temperature sensing signals V_T1 and V_T2 is outputted as the first output signal V_TT1.

Figure 5:
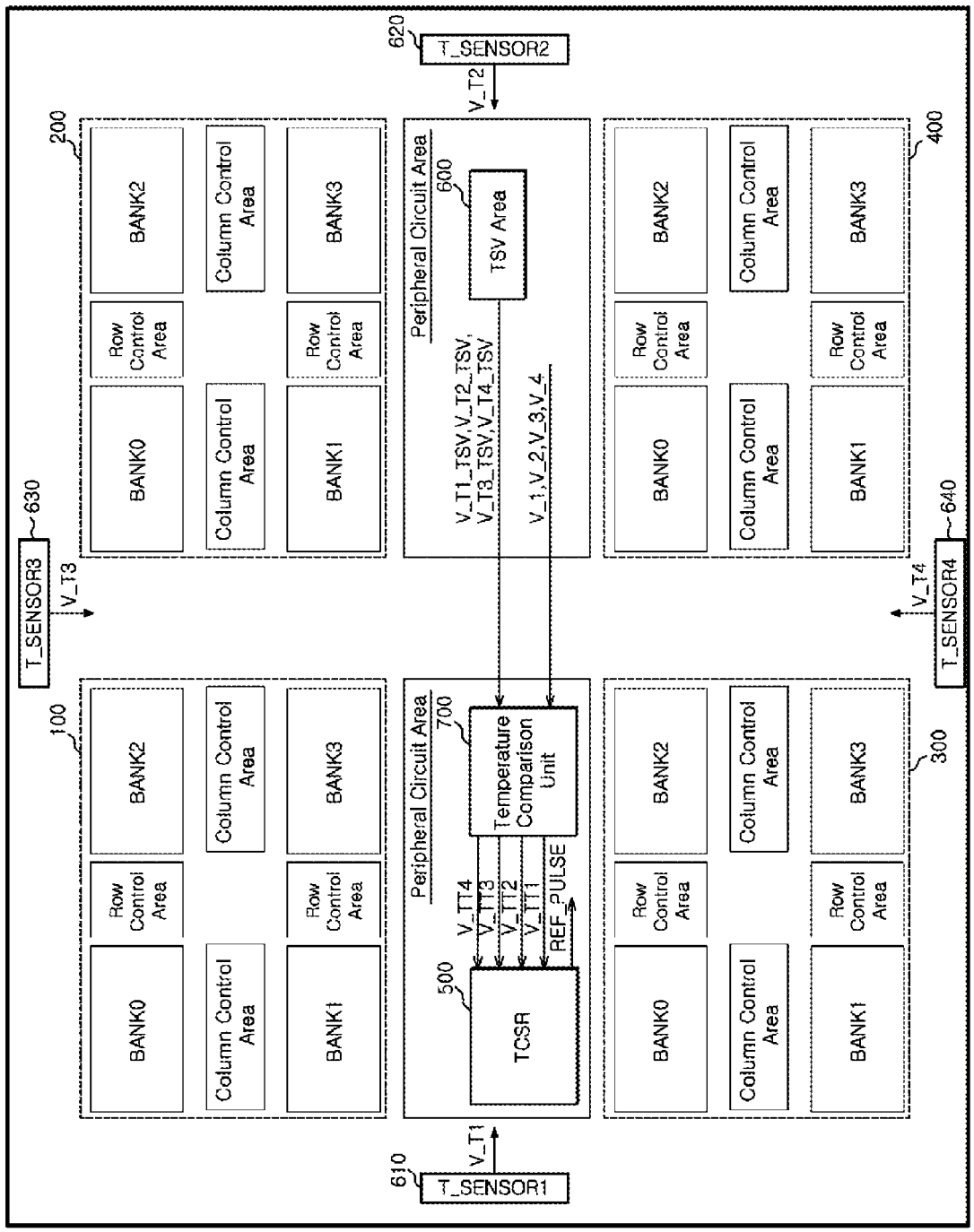
FIG. 5 is a diagram illustrating the structure of a semiconductor memory apparatus according to an embodiment of the present invention.

FIG. 5 is a diagram illustrating the structure of a semiconductor memory apparatus according to an embodiment of the present invention.

The semiconductor memory apparatus according to FIG. 5 includes only simple components for clearly describing the technical idea of the present invention.

The semiconductor memory apparatus of FIG. 5 includes, for example, a plurality of semiconductor memory chips illustrated in FIG. 2. Here, the semiconductor memory apparatus may be formed by stacking the plurality of semiconductor memory chips. Among the plurality of semiconductor memory chips, for example, only one semiconductor memory chip includes the TCSR 500.

Referring to FIG. 5, the semiconductor memory apparatus includes a plurality of chips which are vertically stacked and exchange signals through a plurality of through-chip vias. In an embodiment of the present invention, a chip including a TCSR 500 among the plurality of chips will be representatively described.

Each of the chips forming the semiconductor memory apparatus according to an embodiment of the present invention includes a plurality of memory blocks 100, 200, . . . , 400, a plurality of temperature sensors 610, 620, . . . , 640, a TCSR 500, and a temperature comparison unit 700. Furthermore, a TSV area 600 of the chip includes a plurality of through-chip vias TSV formed therein, through which signals are transmitted and received between the stacked chips.

The basic operation of the semiconductor memory apparatus of FIG. 5 is identical to that of the semiconductor memory apparatus of FIG. 2. Therefore, the following descriptions will be focused on the use of preliminary temperature sensing signals transmitted through the through-chip vias TSV.

Each of the chips transfers its preliminary temperature sensing signals to an adjacent chip through the plurality of through-chip vias TSV. The chip compares the preliminary temperature sensing signals transferred from the adjacent chip to its preliminary temperature sensing signals through the temperature comparison unit, and transfers, for example, only a preliminary temperature sensing signal indicating the highest temperature through a through-chip via.

The TCSR 500 included in any one of the plurality of chips controls the activation cycle of a refresh periodic signal according to any one preliminary temperature sensing signal indicating, for example, the highest temperature among the plurality of preliminary temperature sensing signals transferred through the plurality of through-chip vias. In an embodiment of the present invention, since the TCSR 500 is disposed, for example, at the lowermost chip of the plurality of chips, the chip compares its preliminary temperature sensing signals to the preliminary temperature sensing signals transferred to the plurality of through-chip vias through the temperature comparison unit 700, and transfers the comparison result to the TCSR 500.

As a result, the TCSR 500 decides a refresh operation cycle using a preliminary temperature sensing signal reflecting the highest temperature among the plurality of preliminary temperature sensing signals outputted from the respective chips. The refresh cycles of the plurality of chips are equally determined by the TCSR 500. Therefore, although the temperature of any one chip among the plurality of chips excessively increases or the temperature of a specific spot increases, it is possible to secure the reliability of data stored in the plurality of chips.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a plurality of memory blocks;
a plurality of temperature sensors disposed adjacent to the respective memory blocks and configured to output a plurality of preliminary temperature sensing signals whose voltage levels are controlled in response to temperature change, and
a temperature compensated self refresh circuit (TCSR) configured to control an activation cycle of a refresh periodic signal in response to a temperature sensing signal,
wherein a preliminary temperature sensing signal indicating the highest temperature among the plurality of preliminary temperature sensing signals is detected and used as the temperature sensing signal.

2. The semiconductor memory apparatus according to claim 1, wherein the plurality of preliminary temperature sensing signals have a voltage level which decreases in response to a temperature increase.

3. The semiconductor memory apparatus according to claim 1, wherein the TCSR comprises:
a plurality of temperature comparison units configured to compare the plurality of preliminary temperature sensing signals and output a preliminary temperature sensing signal having the lowest voltage level as a temperature sensing signal; and
a refresh periodic signal generation unit configured to control the activation cycle of the refresh periodic signal in response to change in voltage level of the temperature sensing signal.

4. The semiconductor memory apparatus according to claim 3, wherein each of the temperature comparison units comprises:
a comparator configured to compare voltage levels of first and second preliminary temperature sensing signals and output the comparison result as a primary select signal and a secondary select signal; and
a selector configured to selectively output any one of the first and second preliminary temperature sensing signals according to control of the primary select signal and the secondary select signal.

5. A semiconductor memory apparatus comprising a plurality of chips which are vertically stacked and configured to exchange signals through a plurality of through-chip vias,
wherein one or more of the chips comprise:
a plurality of memory blocks; and
a plurality of temperature sensors disposed adjacent to the respective memory blocks and configured to output a plurality of preliminary temperature sensing signals whose voltage levels are controlled in response to temperature change,
when the chip transfers a plurality of preliminary temperature sensing signals thereof to an adjacent chip through the plurality of through-chip vias, the chip compares the preliminary temperature sensing signals thereof to the preliminary temperature sensing signals transferred from the adjacent chip, and transfers a preliminary temperature sensing signal indicating the highest temperature, and
a TCSR included in any one of the plurality of chips is configured to control an activation cycle of a refresh periodic signal according to any one preliminary temperature sensing signal indicating the highest temperature among the plurality of preliminary sensing signals transferred through the plurality of through-chip vias.

6. The semiconductor memory apparatus according to claim 5, wherein
the plurality of chips perform a refresh operation when the refresh periodic signal is activated.

7. The semiconductor memory apparatus according to claim 5, wherein the plurality of preliminary sensing signals have a voltage level which decreases in response to a temperature increase.

8. The semiconductor memory apparatus according to claim 7, wherein the TCSR comprises:
a plurality of temperature comparison units configured to compare the plurality of preliminary temperature sensing signals and output a preliminary temperature sensing signal having the lowest voltage level as a temperature sensing signal; and
a refresh periodic signal generation unit configured to control the activation cycle of the refresh periodic signal in response to change in the voltage level of the temperature sensing signal.

9. The semiconductor memory apparatus according to claim 8, wherein the activation cycle of the refresh periodic signal becomes shorter as the voltage level of the temperature sensing signal decreases.

10. The semiconductor memory apparatus according to claim 7, wherein each of the temperature comparison units comprises:
a comparator configured to compare voltage levels of first and second preliminary temperature sensing signals and output the comparison result as a primary select signal and a secondary select signal; and
a selector configured to selectively output any one of the first and second preliminary temperature sensing signals according to control of the primary select signal and the secondary select signal.

11. A semiconductor memory apparatus comprising:
a first temperature sensor arranged at a first region of the semiconductor memory apparatus;
a second temperature sensor arranged at a second region of the semiconductor memory apparatus;
a temperature comparison unit configured to compare sensing results of the first and second temperature sensors; and
a controller configured to control operations of the first and second regions in response to the output of the temperature comparison unit,
wherein the controller comprises a temperature compensated self refresh circuit (TCSR) configured to control an activation cycle of a refresh periodic signal.

12. The semiconductor memory apparatus according to claim 11, wherein the controller is configured to control the operations of the first and second regions according to the higher temperature between the temperatures of the first and second regions.

13. The semiconductor memory apparatus according to claim 11, wherein the controller is configured to control a refresh operation.

14. The semiconductor memory apparatus according to claim 11, wherein the temperature comparison units comprises:
- a comparator configured to compare voltage levels of first and second preliminary temperature sensing signals and output the comparison result as a primary select signal and a secondary select signal; and
- a selector configured to selectively output any one of the first and second preliminary temperature sensing signals according to control of the primary select signal and the secondary select signal.

* * * * *